United States Patent
Stecker et al.

(10) Patent No.: US 7,192,802 B2
(45) Date of Patent: Mar. 20, 2007

(54) ALD ZNO SEED LAYER FOR DEPOSITION OF ZNO NANOSTRUCTURES ON A SILICON SUBSTRATE

(75) Inventors: Lisa H. Stecker, Vancouver, WA (US); John F. Conley, Jr., Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 264 days.

(21) Appl. No.: 10/976,594

(22) Filed: Oct. 29, 2004

(65) Prior Publication Data

US 2006/0091499 A1  May 4, 2006

(51) Int. Cl.
*H01L 21/00* (2006.01)
(52) U.S. Cl. .......... 438/57; 438/104; 257/E51.016; 257/E51.029
(58) Field of Classification Search .......... 438/57, 438/104; 257/E51.016, E51.029
See application file for complete search history.

(56) References Cited

U.S. PATENT DOCUMENTS

| 6,979,489 B2 * | 12/2005 | Lu et al. .......... 428/209 |
| 2003/0213428 A1 * | 11/2003 | Lu et al. .......... 117/104 |
| 2005/0009224 A1 * | 1/2005 | Yang et al. .......... 438/57 |
| 2005/0223969 A1 * | 10/2005 | Chen et al. .......... 117/105 |
| 2006/0189018 A1 * | 8/2006 | Yi et al. .......... 438/47 |

OTHER PUBLICATIONS

Article entitled, "Vapor-Liquid-Solid Mechanism of Single Crystal Growth" by R.E. Wagner et al., published in Applied Physics Letters, Mar. 1, 1964, vol. 4, No. 5, pp. 89-90.
Article entitled, "Nanoscale Science and Technology" Building a Big Future from Small Things, by C. M. Kieber, published in MRS Bulleting/Jul. 2003, pp. 486-491.
Article entitled, "Controlled Growth of ZnO Nanowires and Their Optical Properties", by P. Yang et al., published in Adv. Funct. Mater. 2002, 12, No. 5, May, pp. 323-331.
Article entitled, "Room-Temperature Ultraviolet Nanowire Nanolasers", by M. H. Huang et al., published in Science Mag., vol. 292, Jun. 8, 2001, pp. 1897-1899.

\* cited by examiner

*Primary Examiner*—Fernando L. Toledo
(74) *Attorney, Agent, or Firm*—David C. Ripma

(57) ABSTRACT

Zinc-oxide nanostructures are grown without using a metal catalyst by forming a seed layer of polycrystalline zinc oxide on a surface of a substrate. The seed layer can be formed by an atomic layer deposition technique. Growth of at least one zinc-oxide nanostructure is induced on the seed layer. The seed layer can alternatively be formed by using a spin-on technique, such as a metal organic deposition technique, a spray pyrolisis technique, an RF sputtering technique or by oxidation of the seed layer.

9 Claims, 2 Drawing Sheets

ALD ZNO SEED LAYER FOR DEPOSITION OF ZNO NANOSTRUCTURES ON A SILICON SUBSTRATE

BACKGROUND OF THE INVENTION

1. Field of the Invention

The present invention relates to nanotechnology and/or microelectronics. In particular, the present invention relates a method for forming zinc-oxide (ZnO) nanostructures on a silicon (Si) substrate.

2. Description of the Related Art

Nanostructured materials, such as nanowires, nanorods, nanofibers, whiskers, etc., exhibit interesting optical and electronic properties and have been demonstrated for many applications, such as chemical and bio sensors and detectors, LEDs, transistors, lasers, field emitters, etc. See, for example, P. Yang et al., "Controlled growth of ZnO nanowires and their optical properties," Adv. Func. Mat. 12(5), 323 (2002) and C. M. Lieber, "Nanoscale science and technology: Building a big future from small things," MRS Bulletin, pp. 486–491, (July 2003). Zinc oxide (ZnO), in particular, exhibits many interesting properties for nanostructures that could be useful for solid-state optoelectronic light emitters, chemical sensors, and gas detectors.

One of the primary techniques used for forming nanostructures is vapor-liquid-solid (VLS) growth. Other techniques, such as laser ablation and arc discharge, have also been used to form nanostructures. A VLS growth mechanism typically requires a metal catalyst. At an appropriate temperature range, the catalyst forms a liquid solution with the desired growth material. When the liquid droplet becomes supersaturated with the desired growth material, the desired material nucleates, resulting in growth of a nanostructure. For example, a thin film (~3 nm) of a catalyst, such as gold (Au), is often used. Nanostructures are observed to grow wherever Au is present. Selective growth of nanostructures is conventionally achieved by patterning the Au catalyst either by dispersing Au nanoparticles onto a substrate, or by evaporating Au through a patterned shadow mask.

Nevertheless, dispersing particles onto a substrate in the ultra clean environments used for microelectronic fabrication is not desirable. Additionally, the metals used as catalysts for nanostructure growth are typically difficult to etch and, consequently, are difficult to subtractively pattern. Moreover, the metals used as catalysts are typically difficult to chemical mechanical polish (CMP). Accordingly, nanostructure catalyst materials are typically difficult to pattern via conventional microelectronic processes. Further, contamination from using a metal catalyst is also a concern. Accordingly, elimination of the metal catalyst would be beneficial for reducing wafer and equipment contamination.

Consequently, what is needed is a technique for growing ZnO nanostructures without using a metal catalyst.

SUMMARY OF THE INVENTION

The present invention provides a technique for growing ZnO nanostructures without using a metal catalyst.

The advantages of the present invention are provided by a method of forming a zinc-oxide nanostructure in which a substrate is provided, a seed layer of polycrystalline zinc oxide that is at least about 0.5 nm thick is formed on a surface of the substrate, and growth of at least one zinc-oxide nanostructure is induced on the seed layer. In one exemplary embodiment of the present invention, the seed layer is formed by an atomic layer deposition (ALD) technique, such as by using alternating pulses of a diethylzinc precursor and water vapor. According to the present invention, inducing growth of at least one zinc-oxide nanostructure includes exposing the seed layer to zinc vapor in the presence of a trace amount of oxygen. The zinc vapor can be formed by carbothermal reduction of zinc oxide. In another exemplary embodiment of the present invention, the seed layer is formed by using a spin-on technique, such as a metal organic deposition (MOD) technique, a spray pyrolisis technique, an RF sputtering technique or by oxidation of the seed layer.

The present invention also provides a zinc-oxide nanostructure that is formed by forming a seed layer of polycrystalline zinc oxide that is at least about 0.5 nm thick on a surface of a substrate, and inducing growth of at least one zinc-oxide nanostructure on the seed layer. In one exemplary embodiment, the seed layer is formed using an atomic layer deposition (ALD) technique, such as by using alternating pulses of a diethylzinc precursor and water vapor. Each zinc-oxide nanostructure can be induced by exposing the seed layer to zinc vapor in the presence of a trace amount of oxygen. The zinc vapor can be formed by carbothermal reduction of zinc oxide. In another exemplary embodiment of the present invention, the seed layer can be formed by using a spin-on technique, such as a metal organic deposition (MOD) technique, a spray pyrolisis technique, an RF sputtering technique or by oxidation of the seed layer.

The present invention also provides a zinc-oxide nanostructure that includes a substrate, a seed layer that is at least about 0.5 nm thick that is formed on a surface of the substrate, and at least one zinc-oxide nanostructure that is formed on the seed layer. The seed layer can be formed by an atomic layer deposition (ALD) technique, such as by using alternating pulses of a diethylzinc precursor and water vapor. At least one zinc-oxide nanostructure is formed by exposing the seed layer to zinc vapor in the presence of a trace amount of oxygen. The zinc vapor can be generated by carbothermal reduction of zinc oxide. In an alternative embodiment of the present invention, the seed layer is formed by a spin-on technique, such as a metal organic deposition (MOD) technique, a spray pyrolisis technique, an RF sputtering technique or by oxidation of the seed layer.

BRIEF DESCRIPTION OF THE DRAWINGS

The present invention is illustrated by way of example and not by limitation in the accompanying figures in which like reference numerals indicate similar elements and in which.

DETAILED DESCRIPTION OF THE PRESENT INVENTION

The present invention provides two techniques for achieving growth of ZnO nanostructures on a Si substrate that avoid use of a metal catalyst. In one exemplary embodiment of the present invention, ZnO nanostructures are grown on atomic-layer-deposited (ALD) polycrystalline ZnO using a vapor-solid mechanism. In another exemplary embodiment of the present invention, ZnO nanostructures are grown on Metal Organic Deposition (MOD) ZnO, also using a vapor-solid mechanism. For both exemplary embodiments, the present invention produces a more consistent and repeatable nanostructure growth region than is obtained by using conventional techniques of a metal catalyst or by surface roughening. Moreover, because an eventual goal is to integrate nanostructures into a Si CMOS process, elimination of use of a metal catalyst for growing ZnO nanostructures also avoids metal-catalyst contamination of Si CMOS devices, which is potentially deleterious to Si CMOS devices.

Figure 1:
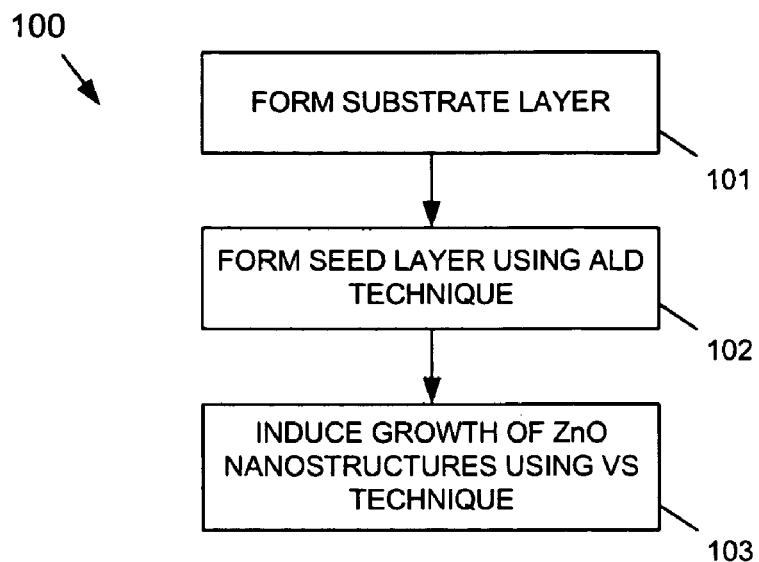
FIG. 1 depicts a flowchart for a first exemplary embodiment of a technique for forming ZnO nanostructures according to the present invention.
Figure 2A:
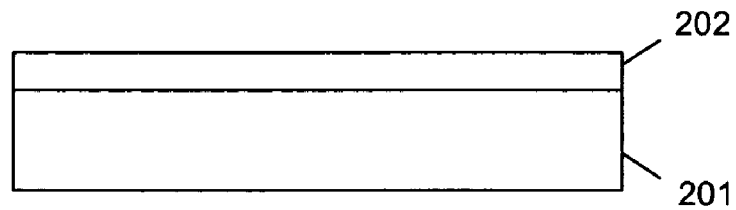
FIGS. 2A and 2B depict a sequence of cross-sectional views of a substrate and ZnO nanostructures that are formed by the first exemplary embodiment of a technique for forming ZnO nanostructures according to the present invention.
Figure 2B:
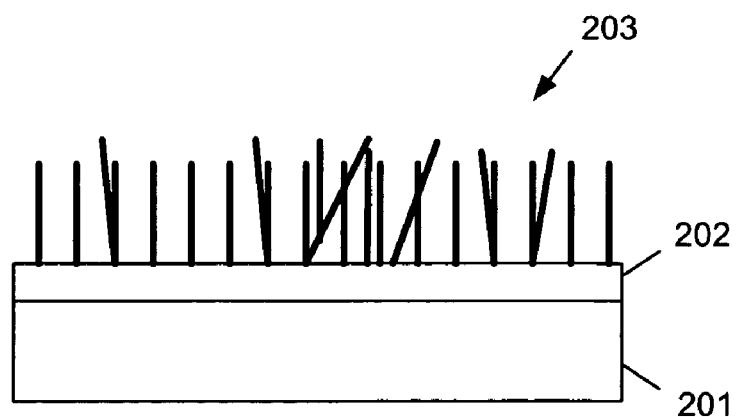

FIG. 1 depicts a flowchart for a first exemplary embodiment 100 of a technique for forming ZnO nanostructures according to the present invention. FIGS. 2A and 2B depict a sequence of cross-sectional views of a substrate and ZnO nanostructures that are formed by the first exemplary embodiment of a technique for forming ZnO nanostructures according to the present invention. At step 101 in FIG. 1, a clean Si <100> or Si <111> starting wafer is used as a substrate layer 201 (FIG. 2A). At step 102, a thin seed layer 202 of polycrystalline ZnO is deposited on the surface of substrate layer 201 using Atomic Layer Deposition (ALD) (FIG. 2A). For ALD, precursors are pulsed alternately into the deposition chamber and are separated by purges. Reactions take place on the substrate surface and are self-limiting. Film thickness is controlled by the number of precursor pulse/purge cycles. The self-limiting nature of the process allows for uniformity and excellent conformality. In one exemplary embodiment, layer 202 is formed by alternating pulses of diethylzinc (DEZ) precursor and $H_2O$ vapor at a substrate temperature of between about 130° C. and 180° C. to form ALD ZnO that is about 6 nm thick. Nanostructure growth has been induced for a seed layer thickness between about 0.5 nm and about 80 nm. In principle, any thickness of ALD ZnO for seed layer 202 could be used. Alternatively, other precursors, such as di-methyl zinc, zinc acetate and zinc chloride, could be used to form ALD ZnO. Additionally, after seed layer 202 is formed, seed layer 202 could be annealed to modify the crystalline structure of seed layer 202.

At step 103, ZnO nanostructure growth is induced via a vapor-solid mechanism to form nanostructures 203, shown in FIG. 2B. The wafer structure formed by layers 201 and 202 and depicted in FIG. 2A is exposed to Zn vapor at about 915° C. for about 30 minutes with a flow of about 30–80 sccm Ar and a trace amount of oxygen. Zinc vapor is generated by, for example, carbothermal reduction of ZnO power using equal parts of ZnO and graphite. In principle, however, any method of supplying gaseous phase Zn for growing ZnO nanostructures would be suitable.

Figure 3:
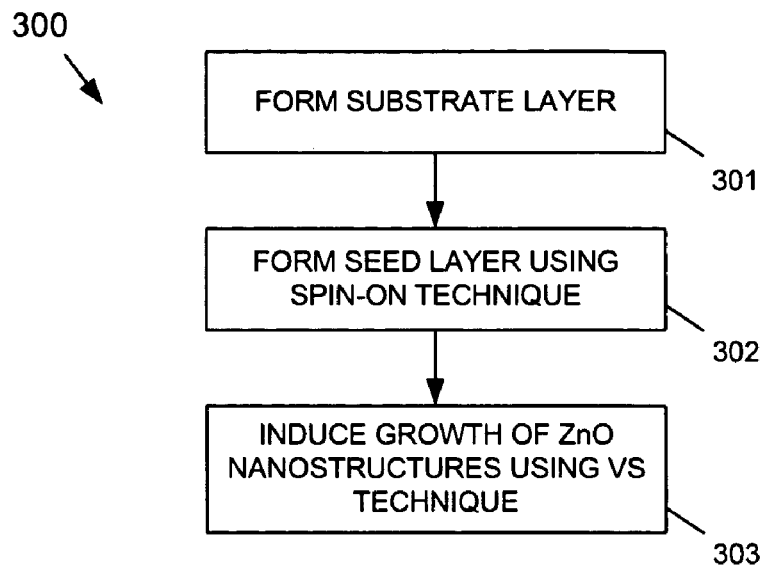
FIG. 3 depicts a flowchart for a second exemplary embodiment of a technique for forming ZnO nanostructures according to the present invention.
Figure 4A:
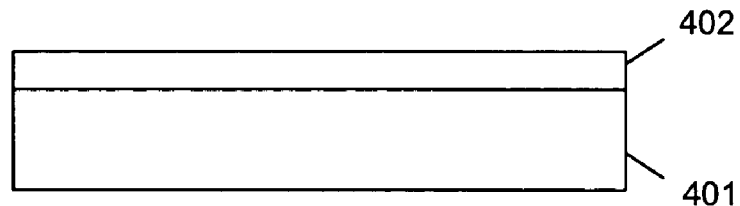
FIGS. 4A and 4B depict a sequence of cross-sectional views of a substrate and ZnO nanostructures that are formed by the second exemplary embodiment of a technique for forming ZnO nanostructures according to the present invention.
Figure 4B:
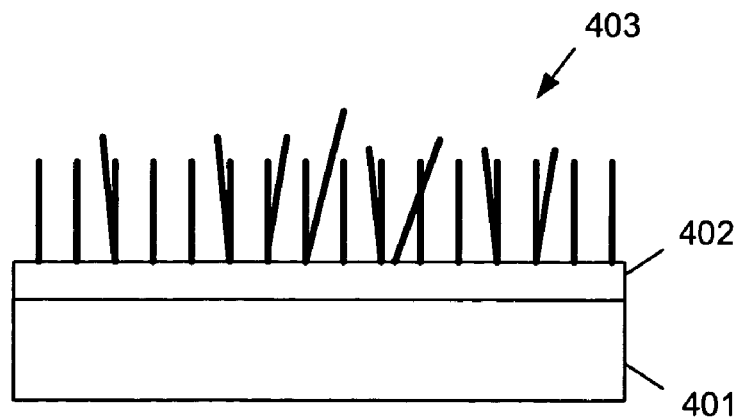

FIG. 3 depicts a flowchart for a second exemplary embodiment 300 of a technique for forming ZnO nanostructures according to the present invention. FIGS. 4A and 4B depict a sequence of cross-sectional views of a substrate and ZnO nanostructures that are formed by the second exemplary embodiment of a technique for forming ZnO nanostructures according to the present invention. At step 301 in FIG. 3, a clean Si <100> or Si <111> starting wafer is used as a substrate layer 401 (FIG. 4A). At step 302, a thin seed layer 402 of polycrystalline ZnO is deposited on the surface of substrate layer 401 using a spin-on technique (FIG. 4A). In one exemplary embodiment, layer 402 is formed by a Metal Organic Deposition (MOD) technique using zinc acetate dehydrate in 2-methoxyethanol and ethanolamine to form MOD ZnO that is about 80 nm thick. Any thickness of MOD ZnO for seed layer 402 could be used. After spin-on coating, the MOD-deposited film was baked for one minute at each of 100° C., 200° C. and 300° C. to drive off residual solvent, and then be subjected to rapid thermal annealing in dry air at 500° C. for two minutes and then at 1000° C. for five minutes. Alternatively, ZnO layer 402 could be deposited using other methods, such as spray pyrolisis, RF sputtering, or by oxidation of a Zn thin film on substrate 401.

At step 303, ZnO nanostructure growth is induced via a vapor-solid mechanism to form nanostructures 403, shown in FIG. 4B. The wafer structure formed by layers 401 and 402 and depicted in FIG. 4A is exposed to Zn vapor at about 915° C. for about 30 minutes with a flow of about 30–80 sccm Ar and a trace amount of oxygen. Zinc vapor is generated by, for example, carbothermal reduction of ZnO power using equal parts of ZnO and graphite. In principle, any method of supplying gaseous phase Zn for growing ZnO nanostructures would be suitable.

In another exemplary embodiment of the present invention described in detail in concurrently filed and co-owned U.S. patent application Ser. No. (Attorney Docket No. SLA0923), entitled "Selective Growth of ZnO Nanostructures Using a Patterned ALD ZnO Seed Layer," invented by J. F. Conley and L. Stecker, and incorporated by reference herein, a ZnO seed layer is patterned prior to nanostructure growth by applying a photoresist resist layer that is exposed and developed using a patterned mask, etched in hydrofluoric acid (HF) and stripped of the photoresist. Vertically aligned ZnO growth is induced via a vapor-solid mechanism to form nanostructures that are similar to nanostructures 403, shown in FIG. 4B. ZnO nanostructure growth occurred only in regions that were left coated with seed layer 402.

A comparison of the nanostructures grown on a seed layer formed by using a spin-on technique with the nanostructures grown on a seed layer formed by an ALD technique reveals variations in morphology, such as nanostructure diameter, nanostructure length, areal density and structure alignment. Thus, use of the same seed material deposited using different methods can be used for tailoring nanostructure morphology.

Although the foregoing invention has been described in some detail for purposes of clarity of understanding, it will be apparent that certain changes and modifications may be practiced that are within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a zinc-oxide nanostructure, comprising:
    providing a substrate;
    forming a seed layer of polycrystalline zinc oxide on a surface of the substrate using an atomic layer deposition technique; and
    inducing growth of at least one zinc-oxide nanostructure on the seed layer.

2. The method according to claim 1, wherein forming the seed layer further includes forming the seed layer using alternating pulses of a diethylzinc precursor and water vapor.

3. The method according to claim 1, wherein the seed layer is at least about 0.5 nm thick.

4. A zinc-oxide nanostructure formed by:
providing a substrate;
forming a seed layer of polycrystalline zinc oxide on a surface of the substrate using an atomic layer deposition technique; and
inducing growth of at least one zinc-oxide nanostructure on the seed layer.

5. The zinc-oxide nanostructure according to claim 4, wherein forming the seed layer further includes forming the seed layer using alternating pulses of a diethylzinc precursor and water vapor.

6. The zinc-oxide nanostructure according to claim 4, wherein the seed layer is at least about 0.5 nm thick.

7. A zinc-oxide nanostructure, comprising:
a substrate;
a seed layer of polycrystalline zinc oxide formed on a surface of the substrate wherein the seed layer is formed by an atomic layer deposition technique; and
at least one zinc-oxide nanostructure formed on the seed layer.

8. The zinc-oxide nanostructure according to claim 7, wherein the seed layer is further formed by using alternating pulses of a diethylzinc precursor and water vapor.

9. The zinc-oxide nanostructure according to claim 7, wherein the seed layer is at least about 0.5 nm thick.

* * * * *